(12) United States Patent
Schepis et al.

(10) Patent No.: US 11,791,167 B2
(45) Date of Patent: Oct. 17, 2023

(54) CYCLIC SELF-LIMITING ETCH PROCESS

(71) Applicant: Tokyo Electron Limited, Tokyo (JP)

(72) Inventors: Anthony R. Schepis, Averill Park, NY (US); Hoyoung Kang, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 190 days.

(21) Appl. No.: 17/121,546

(22) Filed: Dec. 14, 2020

(65) Prior Publication Data
US 2021/0305060 A1    Sep. 30, 2021

Related U.S. Application Data

(60) Provisional application No. 63/002,771, filed on Mar. 31, 2020.

(51) Int. Cl.
*H01L 21/3213* (2006.01)
*H01L 21/321* (2006.01)
*H10B 43/27* (2023.01)
*H10B 43/35* (2023.01)

(52) U.S. Cl.
CPC .. *H01L 21/32137* (2013.01); *H01L 21/32105* (2013.01); *H10B 43/27* (2023.02); *H10B 43/35* (2023.02)

(58) Field of Classification Search
CPC ......... H01L 21/32137; H01L 21/32105; H01L 27/1157; H01L 27/11582; H01L 21/30655; H10B 43/27; H10B 43/35
See application file for complete search history.

(56) References Cited

U.S. PATENT DOCUMENTS

| | | | |
|---|---|---|---|
| 6,696,327 B1 * | 2/2004 | Brask | H01L 29/513 257/E21.641 |
| 8,895,381 B1 * | 11/2014 | Cheng | H01L 29/7847 257/E21.409 |
| 9,230,974 B1 | 1/2016 | Pachamuthu et al. | |
| 9,673,216 B1 | 6/2017 | Baraskar et al. | |

(Continued)

FOREIGN PATENT DOCUMENTS

| | | |
|---|---|---|
| KR | 101117378 B1 | 3/2012 |
| WO | 2016100873 A1 | 6/2016 |

OTHER PUBLICATIONS

International Search Report and the Written Opinion of the International Searching Authority, PCT Application No. PCT/US2021/012069, dated Apr. 27, 2021, 10 pages.

(Continued)

*Primary Examiner* — Eduardo A Rodela
(74) *Attorney, Agent, or Firm* — Slater Matsil, LLP

(57) ABSTRACT

A method of processing a substrate includes forming a channel through a substrate, depositing a layer of polycrystalline silicon on sidewalls of the channel, and oxidizing uncovered surfaces of the polycrystalline silicon with an oxidation agent. The oxidizing agent causes formation of an oxidized layer, the oxidized layer having a uniform thickness on uncovered surfaces of the polycrystalline silicon. The method includes removing the oxidized layer from the channel with a removal agent, and repeating steps of oxidizing uncovered surfaces and removing the oxidized layer until removing a predetermined amount of the layer of polycrystalline silicon.

20 Claims, 14 Drawing Sheets

(56) References Cited

U.S. PATENT DOCUMENTS

| | | |
|---|---|---|
| 9,735,024 B2 | 8/2017 | Zaitsu |
| 2005/0111168 A1* | 5/2005 | Carr ..................... G06F 1/184 |
| | | 361/679.4 |
| 2007/0207628 A1* | 9/2007 | Chua ................ H01L 21/02337 |
| | | 257/E21.268 |
| 2012/0276702 A1* | 11/2012 | Yang ................ H01L 29/66833 |
| | | 438/491 |
| 2014/0027818 A1 | 1/2014 | Asenov |
| 2015/0017772 A1 | 1/2015 | Waite et al. |
| 2015/0137212 A1 | 5/2015 | Ozawa |
| 2016/0079370 A1* | 3/2016 | Sugiyama ......... H01L 21/02488 |
| | | 438/479 |
| 2020/0161325 A1* | 5/2020 | Clampitt .......... H01L 27/11568 |

OTHER PUBLICATIONS

Abdulagatov, Aziz I., et al. "Thermal Atomic Layer Etching of Silicon Using O2, HF, and Al(CH3)3 as the Reactants," American Chemical Society, Chemistry of Materials, 2018, 11 pages.

Huard, Chad M., "Atomic layer etching of 3D structures in silicon: Self-limiting and nonideal reactions," J. Vac. Sci. Technol. A 35(3), May/Jun. 2017, 15 pages.

Smedt, F. De, et al., "A Detailed Study on the Growth of Thin Oxide Layers on Silicon Using Ozonated Solutions," The Electrochemical Society, Inc., Journal of The Electrochemical Society, 147 (3), 2000, 6 pages.

\* cited by examiner

US 11,791,167 B2

CYCLIC SELF-LIMITING ETCH PROCESS

CROSS-REFERENCE TO RELATED APPLICATIONS

This application claims the benefit of U.S. Provisional Application No. 63/002,771, filed on Mar. 31, 2020, which application is hereby incorporated herein by reference.

TECHNICAL FIELD

The present invention relates generally to a method for etching silicon, and, in particular embodiments, to a method for pseudo atomic layer etching of silicon based materials.

BACKGROUND

Planar NAND reached physical scaling limits with 193 nm immersion systems circa 2013. To continue to increase performance and accommodate bit demand, the industry turned toward 3D design incorporating high aspect ratio structures beyond 128 layers. The integration of such 3D architectures has introduced many new challenges.

The move from planar to vertical integration has created several demanding etches in the 3D NAND manufacturing process. A conventional 3D NAND device includes multiple layers of nonvolatile transistors which are stacked and connected via vertical channels. With increasing design density the resultant aspect ratio has risen because of the additional nonvolatile transistors added to the word line stacks. This increase in aspect ratio creates a fundamental challenge with regard to the definition of the polysilicon transistor channel within this vertical channel.

SUMMARY

A method of processing a substrate includes forming a channel through a substrate; depositing a layer of polycrystalline silicon on sidewalls of the channel; oxidizing uncovered surfaces of the polycrystalline silicon with an oxidation agent, the oxidizing agent causing formation of an oxidized layer, the oxidized layer having a uniform thickness on uncovered surfaces of the polycrystalline silicon; removing the oxidized layer from the channel with a removal agent; and repeating steps of oxidizing uncovered surfaces and removing the oxidized layer until removing a predetermined amount of the layer of polycrystalline silicon.

A method of processing a substrate includes forming a layer of silicon based material having a first thickness over a semiconductor substrate; growing a layer of oxidized silicon based material on the layer of silicon based material by wetting the layer of silicon based material with an oxidizing solution; etching the layer of oxidized silicon based material by wetting the layer of oxidized silicon based material with a oxide etching solution; and repeating the steps of growing and etching until the layer of silicon based material has a second thickness lower than a predetermined thickness.

A method of forming a 3D NAND device includes forming a channel in a 3D NAND dielectric stack; depositing a layer of polysilicon having a first thickness over sidewalls of the channel; performing a cyclic etching process, where each cycle includes forming an oxide layer on the layer of polysilicon by wetting exposed surfaces of the layer of polysilicon with a first solution including an oxidizing agent, and removing the oxidized layer from the layer of polysilicon with a second solution including an oxide etching agent; and, where the cyclic etching process is terminated after the layer of polysilicon has a second thickness over the sidewalls of the channel, the second thickness being lower than the first thickness by a predetermined thickness.

A method of processing a substrate includes depositing a layer of silicon based material on a substrate; oxidizing uncovered surfaces of the silicon based material with an oxidation agent, the oxidizing agent causing formation of an oxidized layer, the oxidized layer having a uniform thickness on uncovered surfaces of the silicon based material; removing the oxidized layer from the silicon based material with a removal agent; and repeating steps of oxidizing uncovered surfaces and removing the oxidized layer until removing a predetermined amount of the layer of silicon based material.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
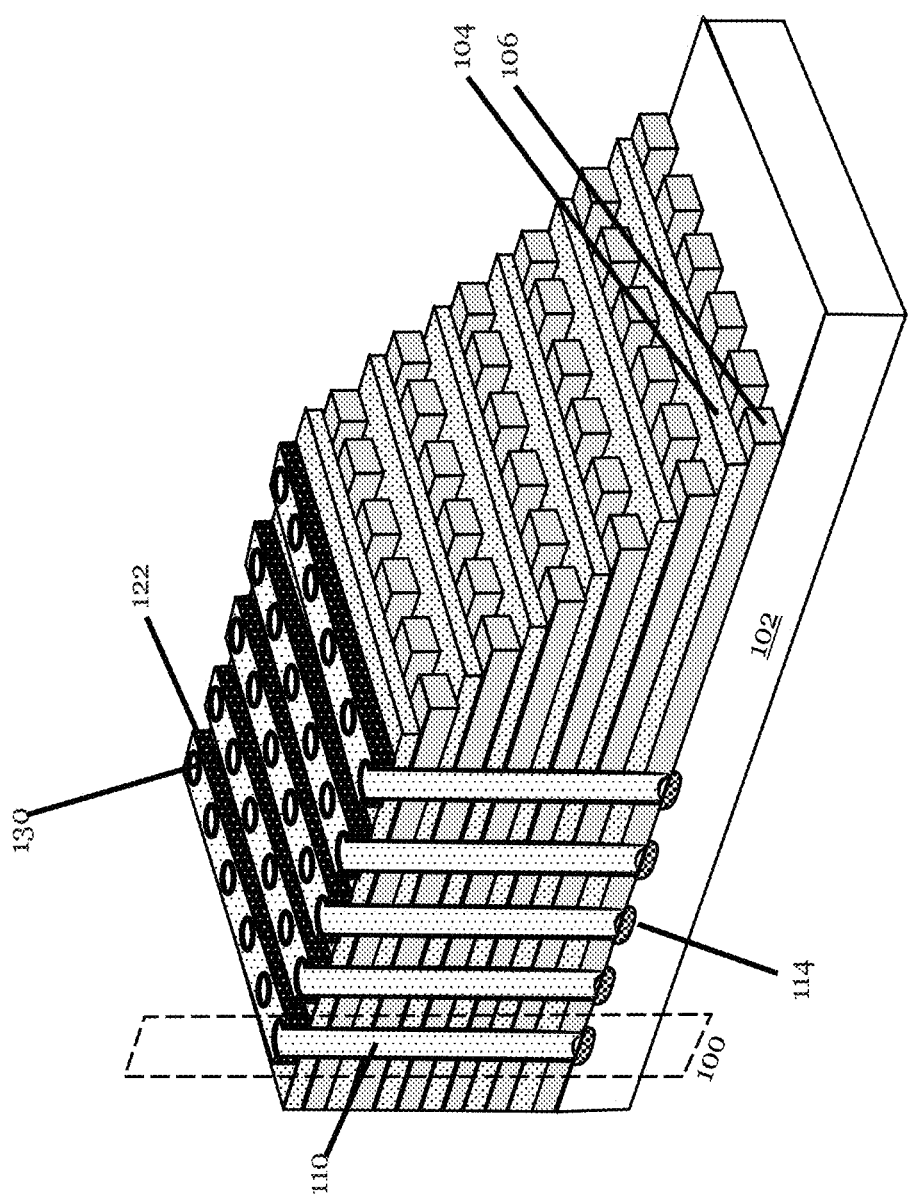
FIG. 1A is a projection view of a cross-section through a 3D-NAND memory array formed in accordance with embodiments of the invention.

Various embodiments provide a self-limited etching method with atomic layer precision. Etching techniques described in this application are applicable to many different semiconductor device fabrication schemes, and is useful for any integration scheme that includes a silicon-based etch. For example, etching techniques herein can be used to etch layers or structures of single-crystal silicon, poly crystalline silicon, and any other silicon-containing layers that can become oxidized. Although etching techniques herein can be applied to many different etch schemes, for convenience in describing embodiments herein, discussion will primarily focus on two sample cases—an application to etching polysilicon in 3D memory architectures and to etching single crystal silicon in planar, fully depleted, silicon on insulator (FDSOI) integrated circuits. However, embodiments of the present application can be applied to not only other type of 3D stacked memories and logic devices but also to forming other high aspect ratio features such as through via and deep trench structures.

The 3D architectures have a unique challenge presented by topology of the 3D structure. Controlling the polysilicon transistor channel thickness and uniformity within this high aspect ratio vertical channel is important to preserve transistor performance and to reduce transistor-to-transistor variability. Various embodiments described in this disclosure enable chip makers to stringently control the polysilicon etch with atomic level precision.

The FDSOI architectures have the challenge of requiring the formation of a very thin single crystal silicon channel with very uniform thickness. In fully depleted silicon on insulator (FDSOI) transistors, a thin layer of single crystal silicon forms the FDSOI transistor channel. Controlling the FDSOI transistor channel thickness and uniformity is important to preserve FDSOI transistor performance and to reduce transistor-to-transistor variability. Various embodiments described in this disclosure enable chip makers to stringently control single crystal silicon etch of the FDSOI transistor channel with atomic level precision.

Although the embodiments are described in a specific context for a 3D NAND application and also for a FDSOI application, various embodiments may be applied to any silicon-based etch in semiconductor manufacturing. Accordingly, various embodiments disclose etching of silicon-based materials in a semiconductor manufacturing processes with atomic level precision and control. Various embodiments provide an etching method that it is self-limiting and independent of etchant concentration (non-transport limited) resulting in atomic level control.

Increased density in 3D NAND device designs is achieved by increasing the number of layers in a 3D NAND stack. Each set of layers forms an individual nonvolatile memory transistor. Over the past several years, the number of layers in the word line stack has increased from 32 to 64 layers and future architectures are may include 128 layers and higher. These layers are typically composed of alternating layers of polysilicon and oxide, or alternating layers of dielectric materials such as silicon dioxide and silicon nitride.

A first embodiment of the pseudo atomic layer silicon base material etching process will be described using cross sectional views of a 3D NAND structure illustrated in FIG. 1 being fabricated using FIGS. 2A-2J along with the flow chart of FIG. 3. Next, a second embodiment of the pseudo atomic layer silicon base material etching process will be described using cross sectional views of an FDSOI structure illustrated in FIG. 4 being fabricated using FIGS. 5A-5H along with the flow chart of FIG. 6.

FIG. 1A illustrates a projection view through a cross-section of a 3D-NAND memory array formed in accordance with embodiments of the invention. FIG. 18 illustrates a cross sectional view of an example 3D NAND wordline stack of alternating metal gates (wordlines 106) and silicon dioxide 104 formed in accordance with embodiments of the invention.

FIG. 1A illustrates a semiconductor substrate 102 with a common drain bitline 114 formed. The cross section shows alternating layers of dielectric material, e.g., silicon dioxide 104 that electrically isolate layers of wordlines 106, e.g., made of tungsten. The wordlines 106, e.g., comprising tungsten, are the alternating metal gates of stacked memory transistors in the 3D NAND array. Common source bitlines 122, e.g., comprising polysilicon, cross the top surface of the 3D NAND memory array perpendicular to the wordlines 106 (metal gates). The drain and source bitlines 114 and 122 are connected to the thin transistor channels 126 (shown in FIG. 1B), e.g., made of polysilicon, on the sidewalls of channels 130. The memory transistors in a layer of wordlines 106 all share the common source bitlines 122 and common drain bitlines 114.

The cross section view to be illustrated in FIG. 1B and subsequently in FIGS. 2A-2J through a stack of SONOS nonvolatile transistors in a 3D NAND memory array is depicted by the dashed box 100 in FIG. 1A.

Each SONOS transistor includes a metal gate (wordline 106), example, comprising tungsten that is isolated from the transistor channel 126, example, comprising polysilicon, by gate dielectric 108. Although referred sometimes as SONOS transistors, each of the SONOS transistors is a Metal/Oxide/Nitride/Oxide/Silicon (MONOS) stack. During programming, electrons can be trapped in the silicon nitride layer in the gate dielectric 108. The trapped electrons raise the turn ON voltage of the SONOS nonvolatile transistor. SONOS transistors with electrons trapped in the silicon nitride layer store logic state "1" whereas SONOS transistors without trapped electrons store logic state "0". These logic states are retained for 10 years or more even when the 3D NAND memory is not connected to a power supply.

Multiple SONOS transistors are stacked one on top of another in the word line stack. The metal gate (wordline 106) of one SONOS transistor is isolated from other nonvolatile SONOS transistors stacked above and below by layers of silicon dioxide 104. The stack of SONOS transistors share a common source terminal 112 and also share a common drain terminal 116. A thin layer of lightly doped polysilicon layer 110, e.g., doped between $10^{14}$ cm$^{-3}$ to $10^{17}$ cm$^{-3}$, forms the channels 126 for the stacked SONOS transistors in the 3D NAND memory array. The thin layer of lightly doped polysilicon layer no may be in-situ doped with an n-type dopant to form an n-channel transistor. One end of the thin layer of lightly doped polysilicon layer no is shorted to the common source bitline 122 that is while the opposite end of the thin layer of lightly doped polysilicon layer no is shorted to the common drain bitline 114.

During operation a voltage can be applied to the common drain bitline 114 (drain terminal 116) with the common source bitline 122 (source terminal 112) held at ground. Voltage on the gate terminal 118 can be connected to one of the metal gates (wordline 106) by turning one of the gate select transistors 120 ON. If the SONOS transistor is programmed with a zero (no trapped electrons) the polysilicon channel will turn ON and additional current flows through the channel 126 of the transistor. If, however, the SONOS transistor is programmed with a one (trapped electrons) the channel 126 will remain OFF and no additional current flows. Variability from one SONOS transistor to the next in the 3D NAND memory array depends upon thickness uniformity of the lightly doped polysilicon transistor channel 126 from one SONOS transistor to the next.

As described herein various embodiments, a uniform lightly doped polysilicon transistor channel 126 is formed using a cyclic self-limiting deposition and etch process as further described using FIGS. 2A-2J and 3.

Figures 2A, 2B:
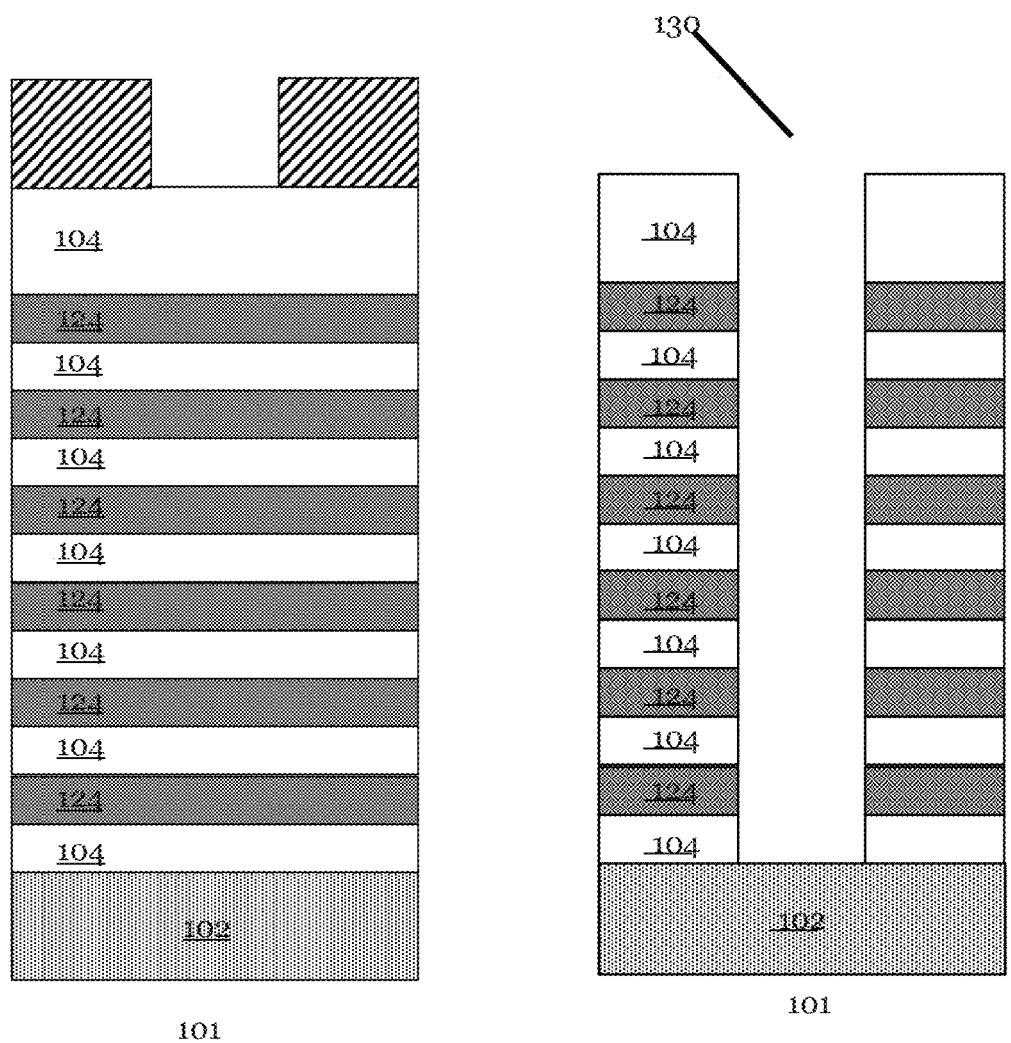
FIGS. 2A-2J are cross-sectional views of the major processing steps in forming the polysilicon transistor channel in a channel opening in a 3D NAND memory array.

Refer now to FIG. 2A, which illustrates a cross-sectional view through a 3D NAND substrate 300. Alternating dielectric layers of silicon dioxide 104 and silicon nitride 124 are layered on top of a semiconductor substrate 102. At this stage of processing, the semiconductor substrate 102 includes a number of device regions including the active transistors regions relating to the array programming and logic transistors as well as the drain bitline 114, which is formed as a diffusion region within the semiconductor substrate 102, and forms the common bitline of the 3D NAND memory.

Although six alternating layers are shown in FIG. 2A, a 3D NAND memory can have more than one hundred alternating layers. A channel pattern 128 is formed on the 3D NAND substrate (Step 140, FIG. 3) with an opening that exposes the surface of the dielectric stack through which a channel is to be etched.

As illustrated next in FIG. 2B, (Step 142, FIG. 3), after forming channel pattern 128 using a lithography process, a channel 130 is formed through the stacked dielectric layers of silicon dioxide 104 and silicon nitride 124. The channel pattern 128 may include a hard mask layer that is resistant to the etching from the subsequent plasma etch process. For example, the channel pattern 128 may comprise a metal nitride such as titanium nitride layer in one embodiment.

The channel 130 stops on the diffusion region of the bitline 114 in the underlying semiconductor substrate 102 or an etch stop layer. The channel 130 may be formed using a plasma etching process within a plasma tool. In various embodiments, the plasma etching process forms a trench with substantially vertical sidewalls. The plasma etching process may include a cyclic process designed to alternately etch the alternating layer of layers of silicon dioxide 104 and silicon nitride 124 in embodiment. Alternatively, the plasma etching process may include a plasma etch tuned to have the same selectivity to etching silicon dioxide and silicon nitride and stops etching on the underlying semiconductor substrate 102.

In various embodiments, the channel 130 may have an aspect ratio of 50:1 to 100:1. In further embodiments, the channel 130 may have an aspect ratio more than 100:1, for example, up to 500:1. Any remaining channel pattern 128 is removed after the channel etch.

Figure 2C:
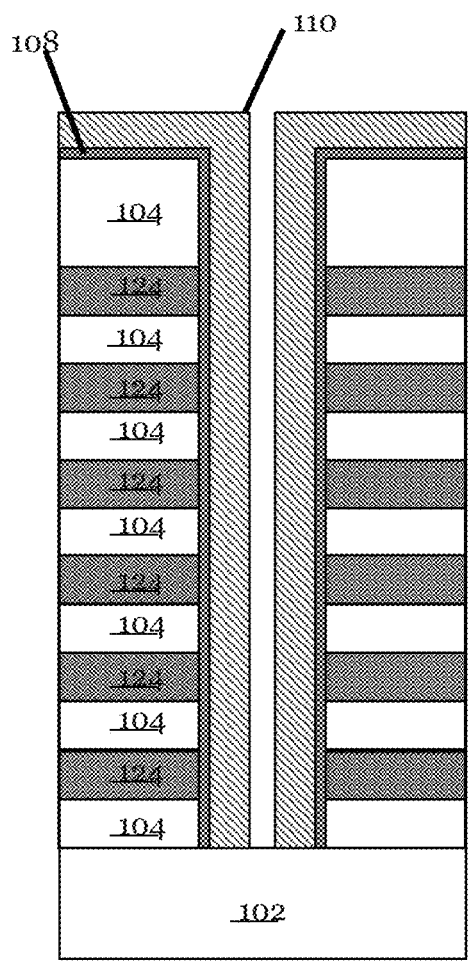
Figure 3:
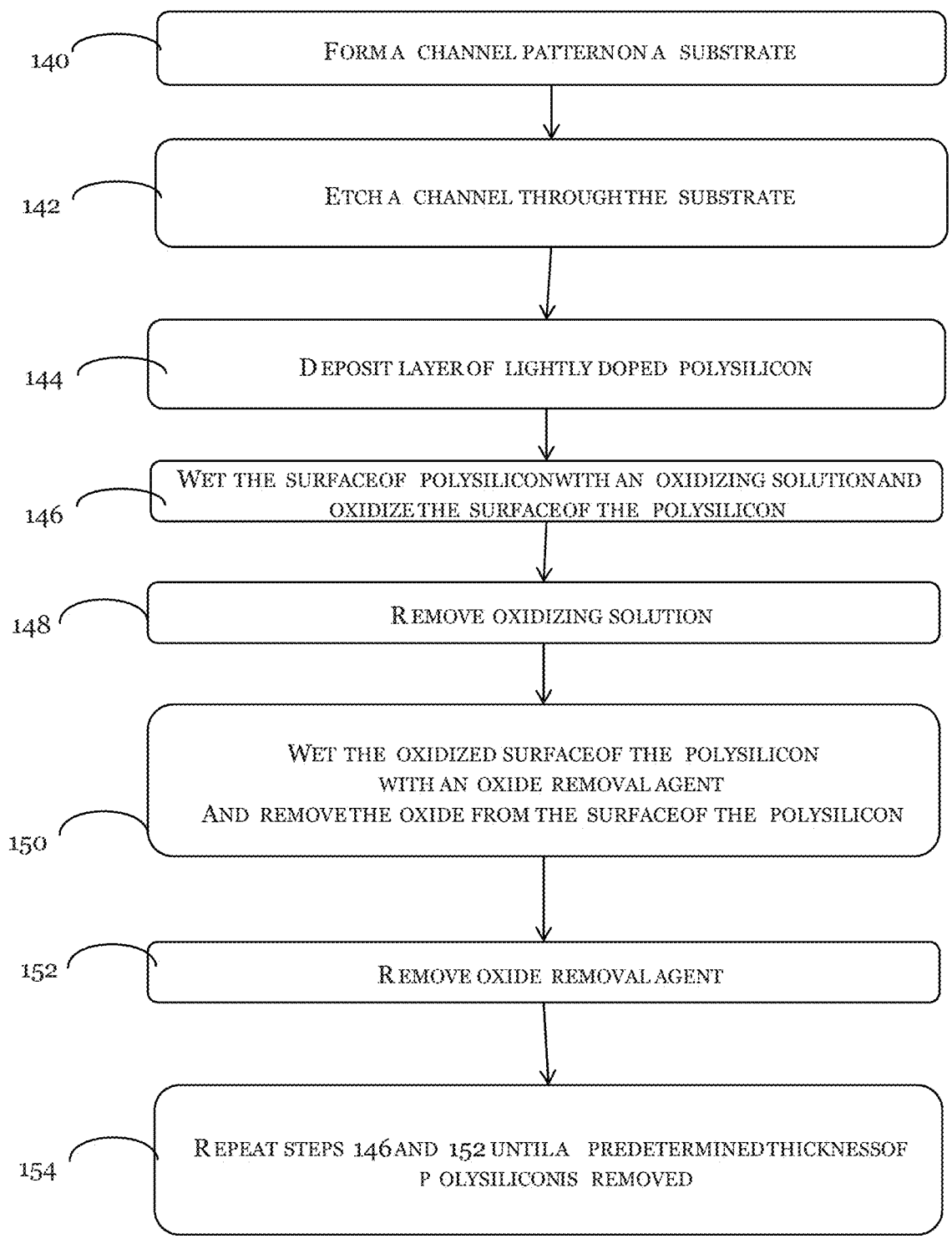
FIG. 3 is a flow diagram describing the processing steps in FIGS. 2A-2J.

In FIG. 2C, after depositing the SONOS gate dielectric 108, a layer of lightly doped polysilicon layer no is deposited (Step 144, FIG. 3). The SONOS gate dielectric 108 is deposited to have a uniform thickness on the vertical sidewalls of the channel 130. In various embodiments, the SONOS gate dielectric 108 may be formed using an atomic layer deposition process. Alternately, the SONOS gate dielectric 108 is formed using other deposition processes including chemical vapor deposition, plasma deposition, and others.

In various embodiments, the SONOS gate dielectric 108 has a thickness of about 2 nm to about 10 nm. The SONOS gate dielectric 108 comprises an Oxide/Nitride/Oxide (ONO) stack in one embodiment. In another embodiment, the gate dielectric 108 comprises a high-k dielectric/Nitride/Oxide stack.

Figure 4:
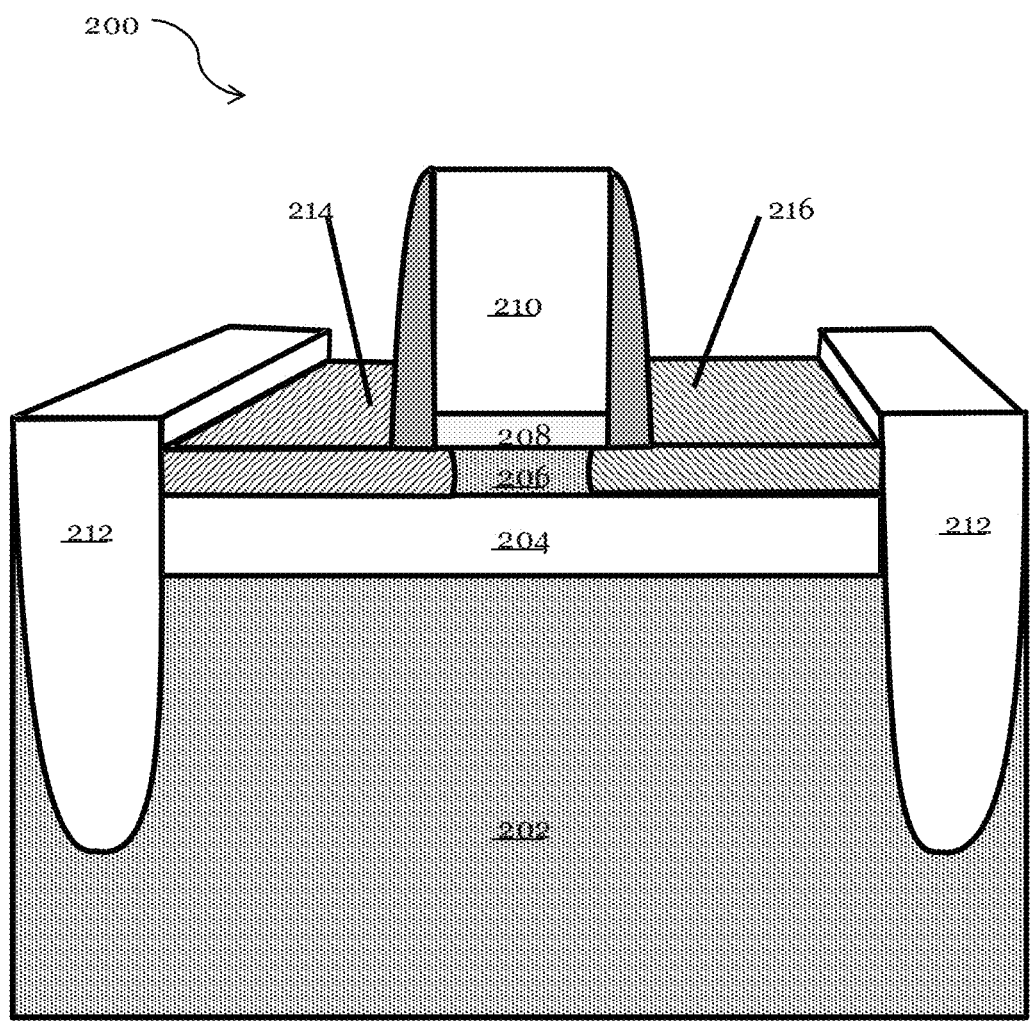
FIG. 4 is a cross-sectional view through a fully depleted silicon on insulator (FDSOI) transistor formed in accordance with embodiments of the invention.

In various embodiments, the polysilicon layer no is typically deposited using a deposition process, e.g., a chemical vapor deposition (CVD) process, capable of covering surface of the 3D-NAND substrate 101 and covering the SONOS gate dielectric 108 with a uniform thickness of polysilicon (Step 144, FIG. 4). In various embodiments, the polysilicon layer 110 is in situ doped to a doping concentration of $10^{14}$ cm$^{-3}$ to $10^{18}$ cm$^{-3}$, and may be doped to be n-type with phosphorus.

Figure 1B:
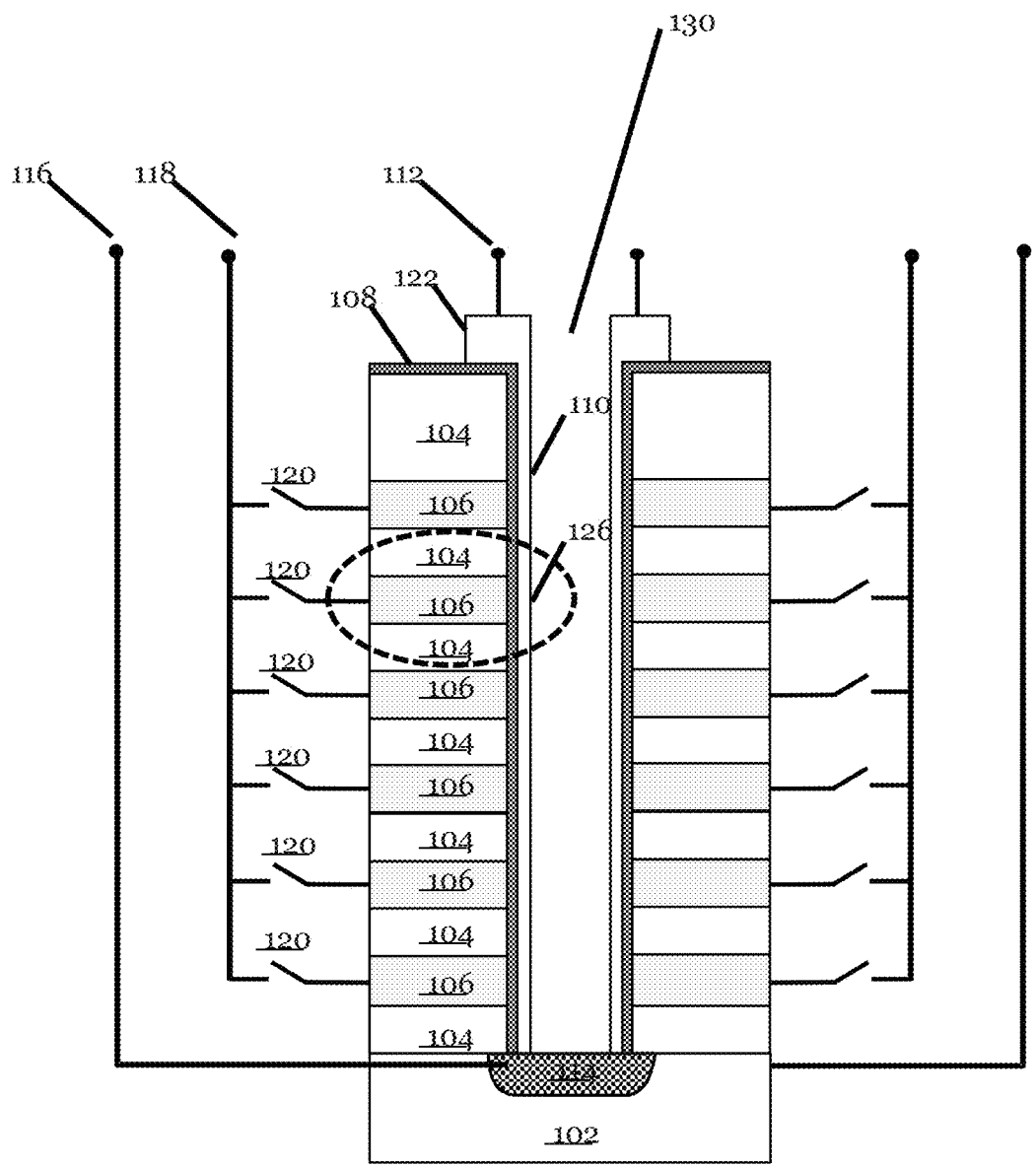
FIG. 1B is a cross-sectional view through a stack of memory transistors in a 3D-NAND memory array formed in accordance with embodiments of the invention.

As previously discussed with respect to FIG. 1B, the polysilicon layer no has to be very thin. Thinning avoids degradation and loss of control of the thin film transistor and improves the transistor's subthreshold characteristics. In various embodiments, the polysilicon layer 110 can be deposited slightly thicker than required and then thinned as required by the SONOS transistor using the embodiment pseudo atomic layer silicon etching process. In various embodiments, the polysilicon layer no after the thinning is about 5 nm to about 50 nm, for example, between 10 nm and 20 nm in one embodiment.

Generally, the polysilicon layer no has to be thinned via a wet-etch process. The large aspect ratio, e.g., 50:1 to 500:1, of the channel 130 however poses a significant challenge for current etch solutions such as tetramethylammonium hydroxide (TMAH) because etching with TMAH becomes transport limited, resulting in etch rates being hampered by concentrations at the bottom of the channel. Limited evacuation of reaction byproducts and replenishment of etchant can result in a non-uniform thinning of the polysilicon layer 110 compromising device performance. For example, the thickness of the polysilicon layer no may become greater at the bottom of the channel 130 and lesser at the top of the channel 130.

Figure 2D:
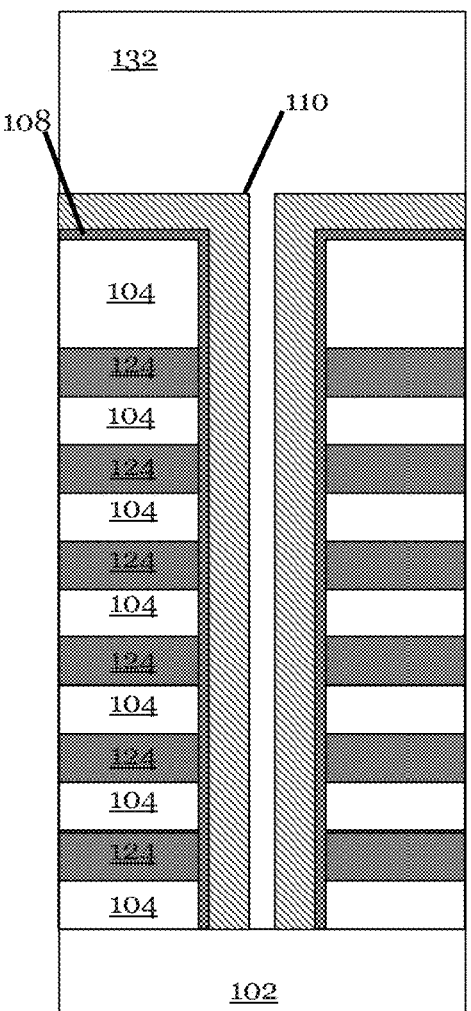
Figure 2E:
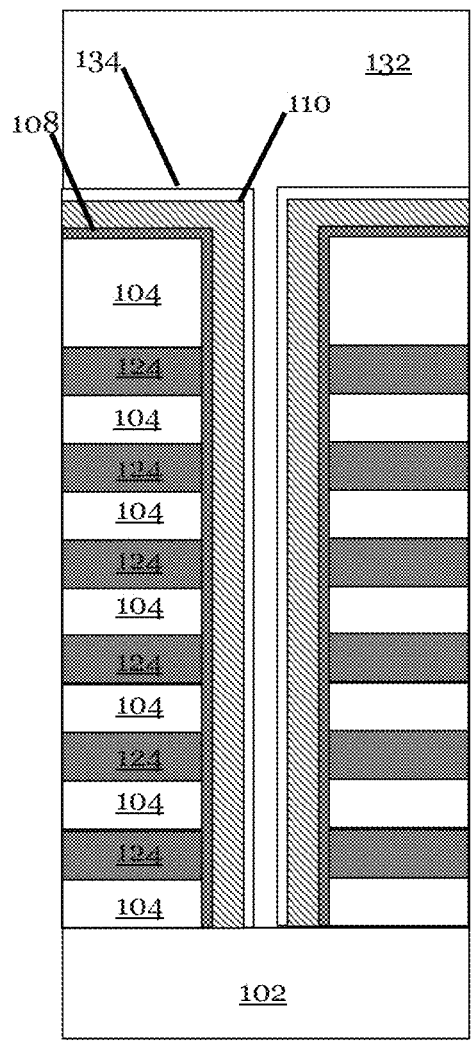

Embodiments of the present application overcome these limitations by using a self-limiting cyclic process. Referring to FIG. 2D, the 3D-NAND substrate 101 is wetted by immersing the 3D-NAND substrate 101 in a bath of oxidizing solution 132, which then seeps into the channel 130 due to surface tension effects (Step 146, FIG. 3). Alternatively, the surface of the polysilicon layer no is wetted with the oxidizing solution 132 using a wet spray etching tool. In one embodiment, the oxidizing solution 132 can be hydrogen peroxide in water with concentration in the range of 1% to 30% by weight. In another embodiment, the oxidizing solution 132 may comprise ozone.

When the oxidizing solution 132 contacts the polysilicon layer no surface, the oxidizing solution 132 rapidly oxidizes the surface forming a layer of oxide 134 (Step 146, FIG. 3). The thickness of the layer of oxide 134 formed is self-limiting and independent of etchant concentration (non-transport limited) resulting in atomic level control. Specifically, the layer of oxide 134 forms a diffusion barrier to the diffusion of the oxidizing solution 132 and to the diffusion of the silicon atoms from the polysilicon layer 110. This prevents further oxidization after all of the exposed surface of the polysilicon layer no is covered with the layer of oxide 134. Once the surface of polysilicon layer no is covered with a layer of oxide 134, additional oxidizing solution 132, e.g., hydrogen peroxide, is blocked from the polysilicon layer no surface and additional oxidation of the polysilicon layer no surface is virtually stopped.

To facilitate completely filling of the, high aspect ratio, channels 130 with the oxidizing solution 132, the 3D-NAND substrate 101 can be first cleaned using carbon dioxide. For example, high pressure carbon dioxide gas can be directed toward the surface of the 3D-NAND substrate 101. Expansion of the carbon dioxide gas causes it to cool and condense as solid carbon dioxide and deposit on the surfaces of the 3D-NAND substrate 101 and channel 130. The warming solid carbon dioxide sublimates increasing volume by as much as 80o times. During this process, the carbon dioxide loosens and sweeps away particles.

Figure 2F:
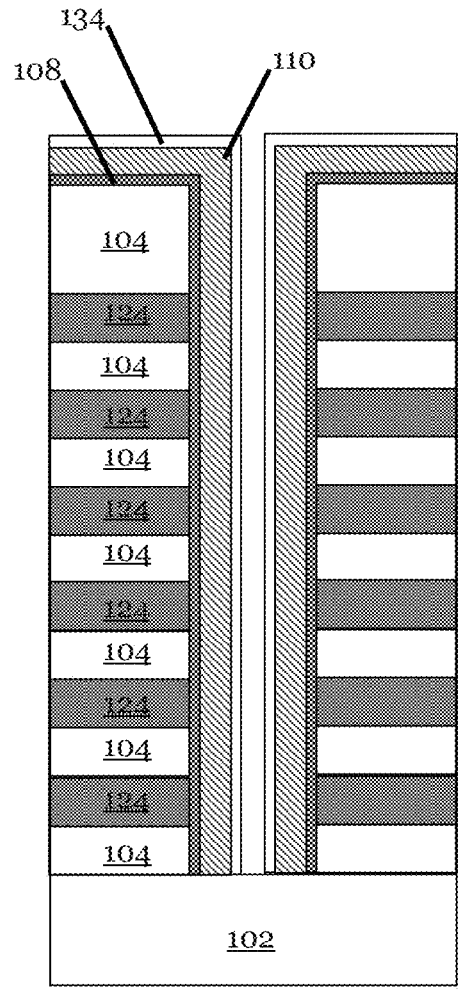

Referring to FIG. 2F, the oxidizing solution 132 is removed (Step 148, FIG. 3). The 3D-NAND substrate 101 can be rinsed with a solvent to aid removal of the oxidizing solution 132. In various embodiments, the 3D-NAND substrate 101 is rinsed by immersing in a bath or by rinsing with solvent in a wet spray etching tool. In one embodiment, the solvent is deionized water.

Figure 2G:
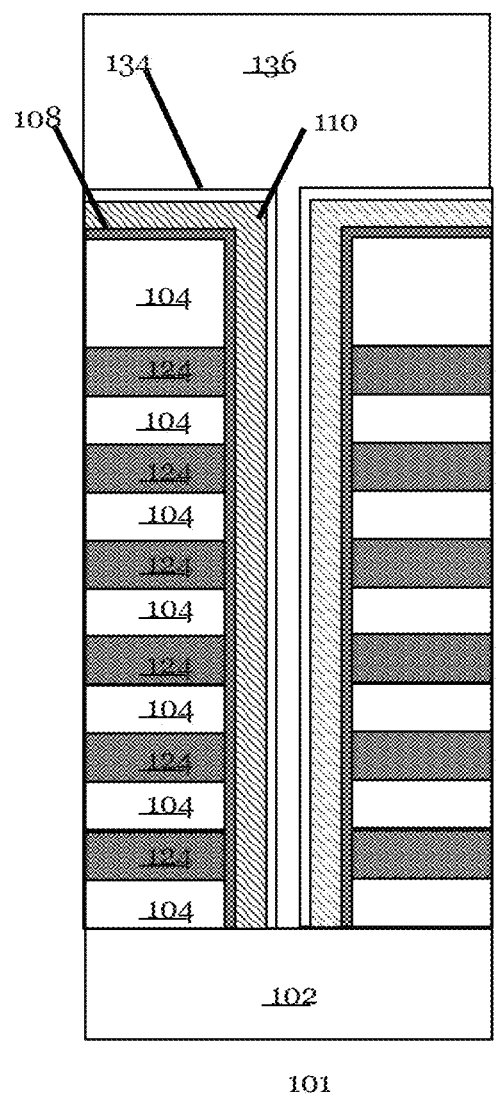

As next illustrated in FIG. 2G, the 3D-NAND substrate 101 is exposed to an oxide removal agent 136 (Step 150, FIG. 3). In the illustration, the oxide removal agent 136 wets the layer of oxide 134. The oxide removal agent 136 can be hydrogen fluoride diluted in water to a concentration in the range of 0.1% to 10% by weight. Once the layer of oxide 134 is removed, the underlying polysilicon layer no is exposed and etching stops. Advantageously, the oxide removal agent is selected so as to not etch the polysilicon layer 110.

Figure 2H:
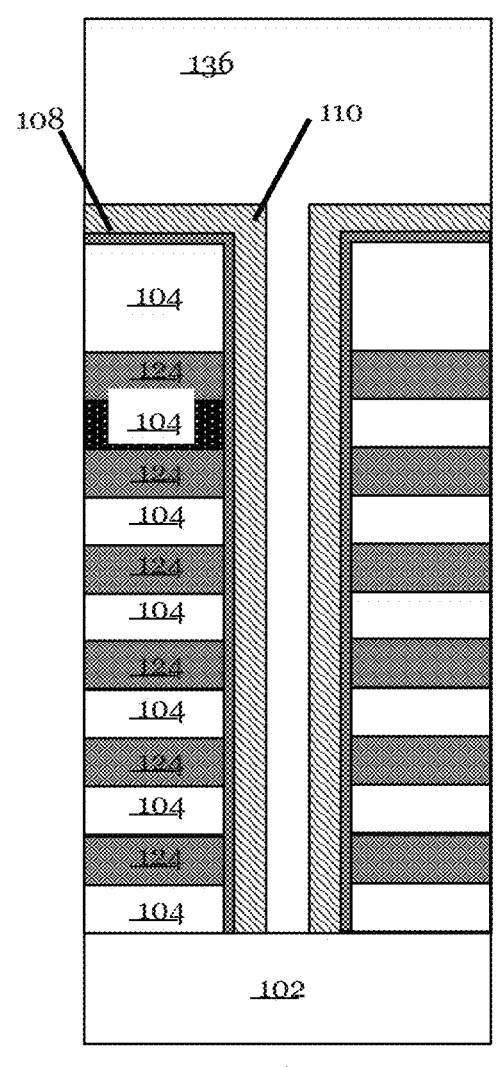

FIG. 2H illustrates the 3D-NAND substrate 101 after the layer of oxide 134 is removed using oxide removal agent 136 (Step 150, FIG. 3).

Figure 2I:
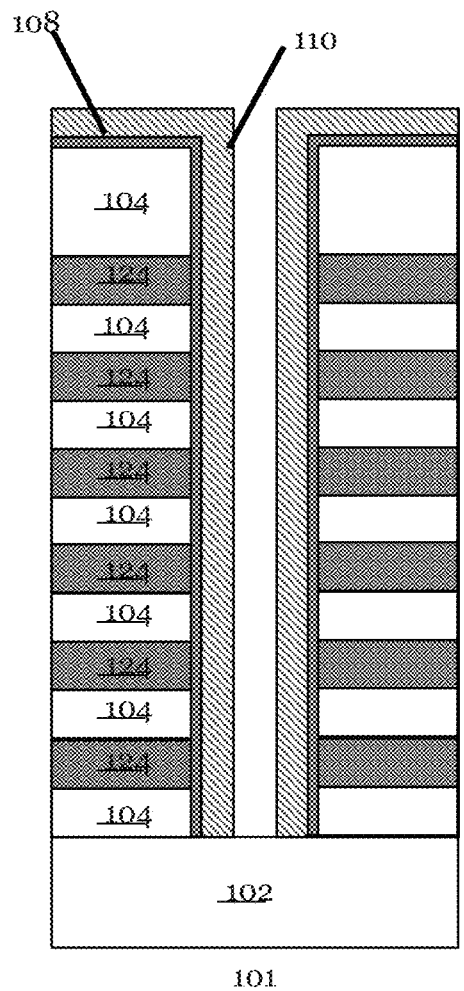
Figure 2J:
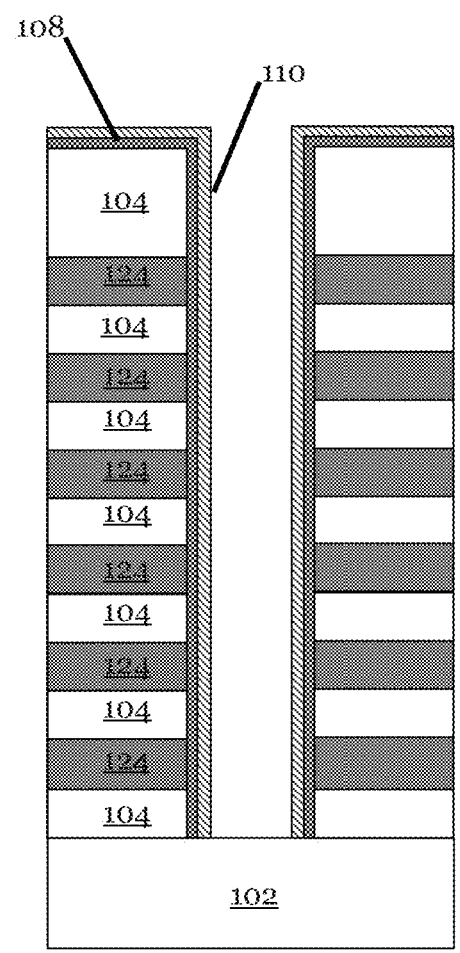

Referring to FIG. 2I, the oxide removal agent 136 is removed (Step 152, FIG. 3). The 3D-NAND substrate 101 can then be rinsed with a solvent to assist removing the oxide removal agent 136. In various embodiments, the 3D-NAND substrate 101 is rinsed by immersing in a bath or by rinsing with solvent in a wet spray etching tool. In one embodiment, the solvent is deionized water.

Step 146 through step 152 can be repeated as many times as required to remove a predetermined thickness of the polysilicon layer 110 (Step 154, FIG. 3). A surface layer of silicon atoms is converted to a layer of oxide 134 (e.g., silicon dioxide) in every cycle during a time the surface of the polysilicon layer no is wetted with the oxidizing solution 132. This surface layer of silicon atoms is then removed when the layer of oxide 134 is etched away with the oxide removal agent 136. By repeating steps 146 through 152, the silicon atoms are removed one layer at a time in a very controlled, uniform manner while at the same reducing the surface roughness of the remaining polysilicon layer 110. By removing a predetermined thickness of the polysilicon layer no in such a controlled and uniform manner, the performance of the SONOS transistors in the 3D-NAND memory array can be precisely targeted and the variation between the SONOS transistors can be kept to a minimum. In various embodiments, the predetermined thickness of the polysilicon layer 110 may be selected to achieve a target surface roughness or target thickness uniformity of the polysilicon layer 110. In one exemplary embodiment, the predetermined thickness of the polysilicon layer 110 may be a fraction of the initial thickness of the polysilicon layer 110, for example, 5% to 20% of the initial thickness of the polysilicon layer 110.

After the polysilicon layer 110 is thinned to meet specification, additional processing which includes replacing the silicon nitride 124 with CVD-tungsten to form the SONOS transistor gates, forming bit lines by forming the common source bitline 122 and electrical connections to the source terminal 112, forming the common drain bitline 114 and electrical connections to the drain terminal 116, forming electrical connections to the gate terminal 118, and forming the gate select transistors 120 can be performed to build the 3D NAND structure depicted in FIGS. 1A and 1B.

FIG. 4 illustrates a cross section through a fully-depleted silicon on insulator (FDSOI) transistor 200 formed in accordance with an embodiment of the present application.

A layer of buried oxide (BOX) 204 isolates the channel formed in the single crystal silicon 206 of the transistor from the underlying substrate 202. The single crystal silicon 206 in a FDSOI transistor 200 is a very thin layer of single crystal silicon, typically less than 150 nm. In FDSOI transistors with ultrathin channels the silicon can be 25 nm or less. The transistor gate 210 is isolated from the channel in the single crystal silicon 206 by a gate dielectric 208. The silicon regions adjacent to the transistor channel in the single crystal silicon 206 are heavily doped forming the transistor source 214 and transistor drain 216. Shallow trench isolation 212 electrically isolates the FDSOI transistor 200 from adjacent transistors and other semiconductor devices in the substrate 202. FDSOI transistor performance is very sensitive to the thickness of the channel formed in the single crystal silicon 206. FDSOI transistor-to-transistor variability is very sensitive to thickness variation of the transistor channel in the single crystal silicon 206 from one FDSOI transistor to the next.

The performance of fully depleted silicon on insulator (FDSOI) transistors 200 is very sensitive to the thickness of the thin channel formed in the single crystal silicon 206. FDSOI transistor-to-transistor 200 variability is sensitive the thickness variation of transistor channel in the single crystal silicon 206 from one transistor to another. The thickness of the single crystal silicon 206 in FDSOI transistors 200 is typically less than 150 nm. In ultrathin FDSOI transistors, the single crystal silicon 206 can be 25 nm or less.

As further described, embodiments of the present invention may be applied to control uniformity of the thickness of the thin single crystal silicon 206.

Thin film transistors (TFT) with polysilicon channels can also be manufactured. They are used in liquid crystal displays for example. These transistors with polysilicon channels are formed on an insulating substrate and, depending upon the polysilicon channel thickness, have similar characteristics to partially depleted silicon on insulator (PDSOI) or fully depleted silicon on insulator (FDSOI) transistors. Like PDSOI and FDSOI transistors with single crystal silicon transistor channels, the performance of TFTs with polysilicon channels is sensitive to thickness and thickness uniformity of the polysilicon transistor channel. Embodiment techniques for controlling the thickness and thickness uniformity of polysilicon transistor channels with atomic layer are equally applicable to polysilicon TFT transistors.

Figure 5A:
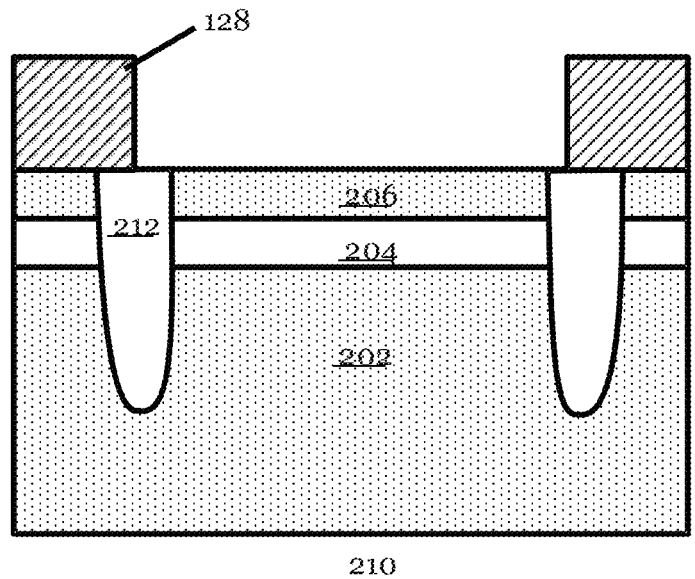
FIGS. 5A-5H are cross-sectional views of the major processing steps in forming the channel in a fully depleted silicon on insulator (FDSOI) transistor.

FIG. 5A illustrates a cross-sectional view through a fully depleted silicon on insulator (FDSOI) substrate 202. The electrically isolated single crystal silicon 206 which forms the transistor channel of the FDSOI transistor can then be thinned with great precision using the embodiment pseudo atomic layer silicon base material etching process. In this manner the thickness of the transistor channel in the single crystal silicon 206 can be reduced to a final thinness required for the FDSOI transistor performance.

A FDSOI transistor channel pattern 128 can be formed on the FDSOI substrate 202 exposing the channel region in the single crystal silicon 206 of one FDSOI transistor and not exposing the transistor channel regions of other FDSOI transistors. In this manner the thickness of the single crystal silicon 206 can be etched to different thicknesses for different FDSOI transistors to make FDSOI transistors with different performance characteristics (Step 230, FIG. 6).

Figure 5B:
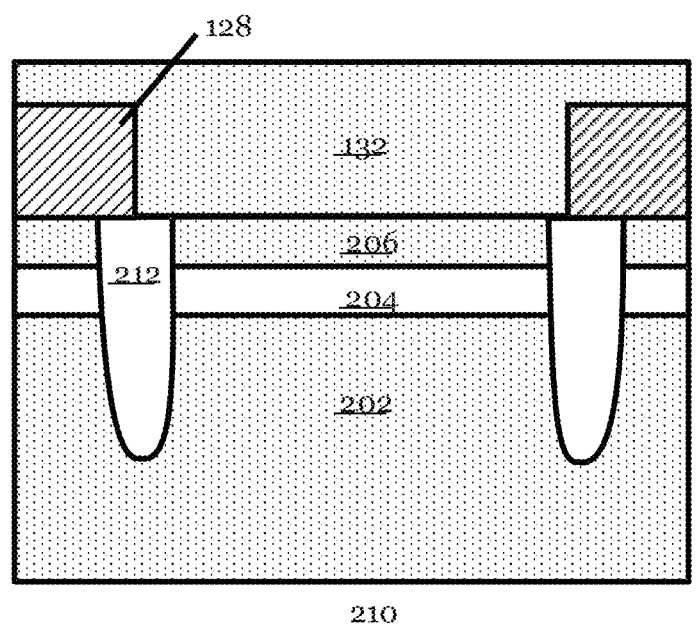
Figure 6:
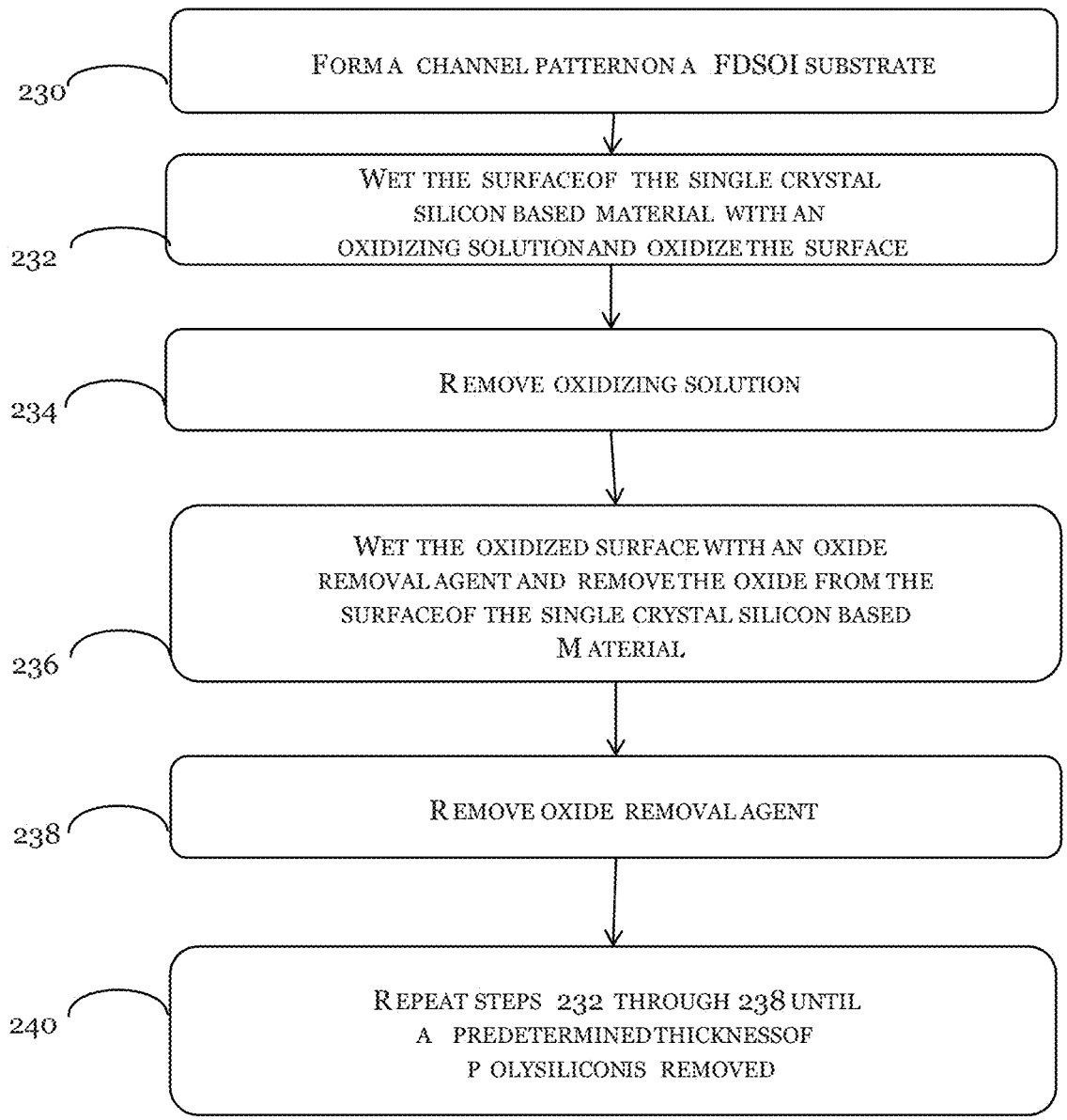
FIG. 6 is a flow diagram describing the processing steps in FIGS. 5A-5H.

In FIG. 5B, the surface of the single crystal silicon channel is wetted with an oxidizing solution 132 (Step 232, FIG. 6).

Figure 5C:
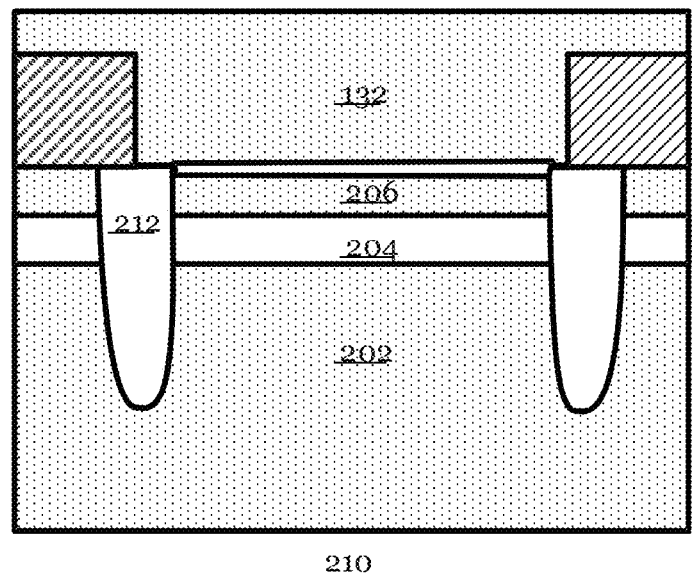

In FIG. 5C, an oxide layer 220, e.g., silicon dioxide, is formed on the single crystal silicon 206 by exposing it to an oxidizing solution 132 (Step 232, FIG. 6). The FDSOI substrate 202 can be wetted by immersing it in a bath of the oxidizing solution 132. Alternatively, the surface of the single crystal silicon 206 can be wetted with the oxidizing solution 132 using a wet spray etching tool. The oxidizing solution 132 can be hydrogen peroxide in water with concentration in the range of about 1% to 30% by weight. When the hydrogen peroxide contacts surface of the single crystal silicon 206 it rapidly oxidizes the surface forming an oxide layer 220. The oxide layer 220 formed is self-limiting. Once the surface of the single crystal silicon 206 is covered with an oxide layer 220, additional hydrogen peroxide is blocked from the surface and additional oxidation of the single crystal silicon 206 surface is virtually stopped. Advantageously, the oxidation will likely smooth the protrusions or trenches on the surface of the single crystal silicon 206 and reduce the surface roughness of the single crystal silicon 206.

Figure 5D:
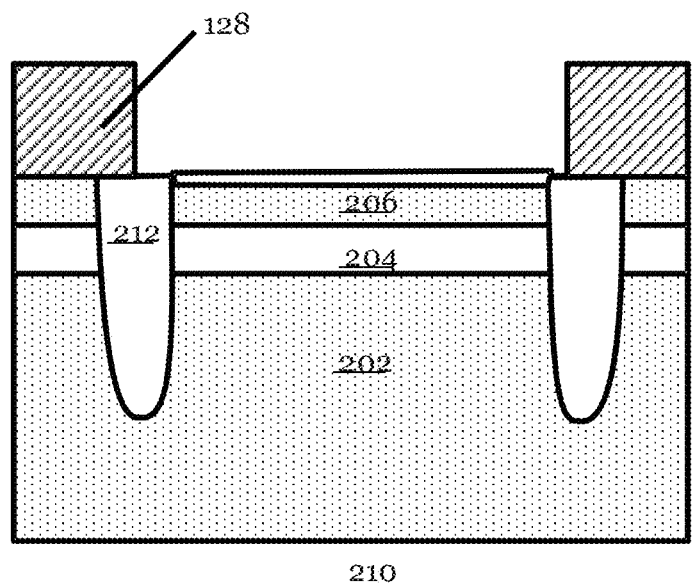

The oxidizing solution 132 is removed in FIG. 5D (Step 234, FIG. 6). The FDSOI substrate 202 can be rinsed with a solvent to aid in removing the oxidizing solution 132. It can be rinsed by immersing it in a bath or by rinsing it with solvent in a wet spray etching tool. The solvent is typically deionized water.

Figure 5E:
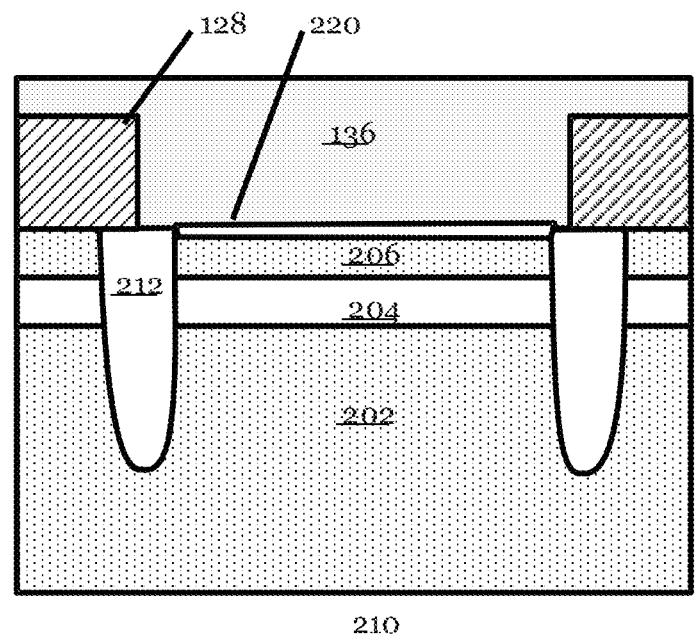

FIG. 5E illustrates the FDSOI substrate 202 with the oxide layer 220 exposed to an oxide removal agent 136 (Step 236, FIG. 6). The oxide removal agent 136 is wetting the oxide layer 220 in the illustration.

Figure 5F:
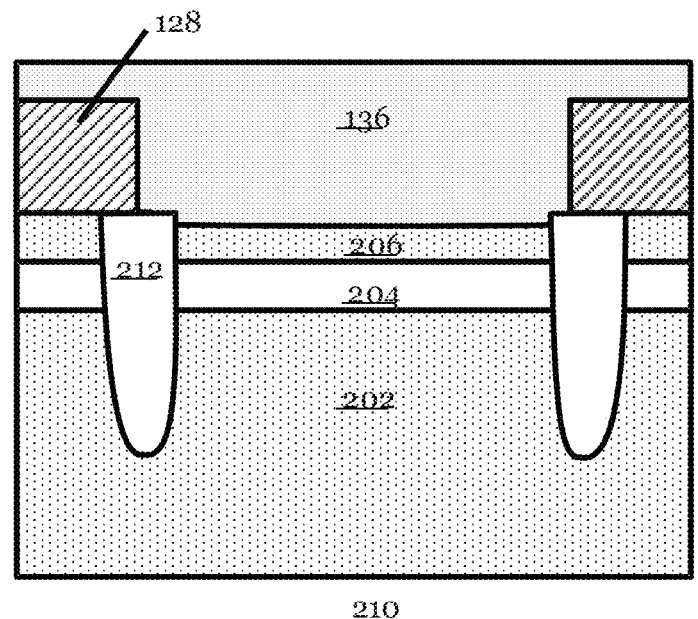

FIG. 5F illustrates the FDSOI substrate 202 after the surface oxide layer 220 is etched from the surface with an oxide removal agent 136 (Step 236, FIG. 6). The oxide removal agent 136 can be hydrogen fluoride in water with concentration in the range of about 0.1% to 10% by weight. Once the oxide layer 220 is removed, the underlying single crystal silicon 206 is exposed and etching stops. The oxide removal agent 136 does not etch the single crystal silicon 206.

Figure 5G:
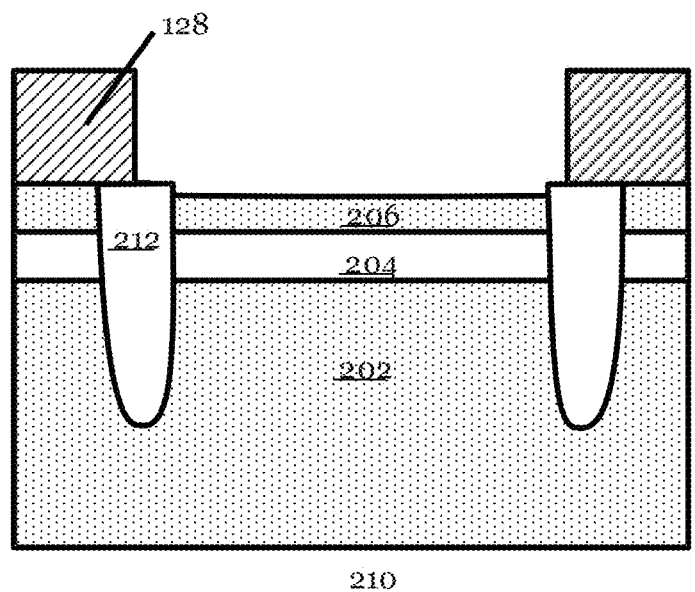
Figure 5H:
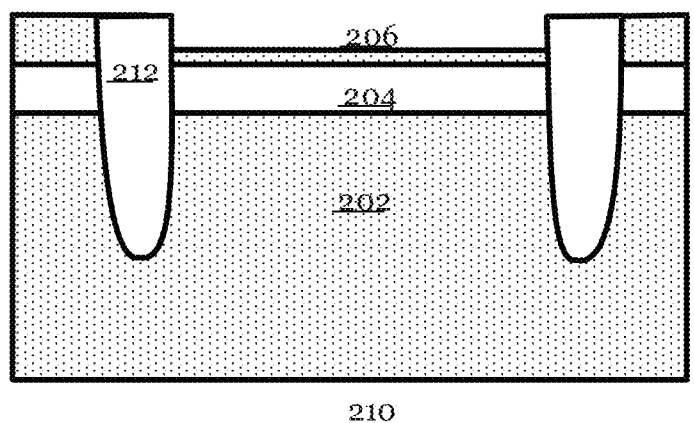

In FIG. 5G, the oxide removal agent 136 is removed (Step 238, FIG. 6). The FDSOI substrate 202 can be rinsed with a solvent to aid removing the oxide removal agent 136. It can be rinsed by immersing it in a bath or by rinsing it with solvent in a wet spray etching tool. The solvent is typically deionized water.

Steps 232 through 238 can be repeated as many times as required to remove a predetermined thickness of the SOI single crystal silicon 206 (Step 240, FIG. 6). A surface layer of silicon atoms is converted into an oxide layer 220 after each time the surface of the SOI single crystal silicon 206 is wetted with the oxidizing solution 132. This surface layer of silicon atoms is then removed when the oxide layer 220 is exposed to the oxide removal agent 136. By repeating steps 232 through 238, the surface layer of silicon atoms is removed one layer at a time in a very controlled manner. By removing a predetermined thickness of the SOI single crystal silicon 206 in such a stringently controlled and uniform manner, the performance of the FDSOI transistors can be precisely targeted and the variation between FDSOI transistors can be kept to a minimum.

After the SOI single crystal silicon 206 is thinned to meet specification, additional processing which includes depositing the gate dielectric 208, depositing and etching the FDSOI transistor gate 210, and doping the source 214 and drain 216 can be performed to produce the FDSOI transistor 200 shown in FIG. 4.

Example embodiments of the invention are summarized here. Other embodiments can also be understood from the entirety of the specification as well as the claims filed herein.

Example 1. A method of processing a substrate, the method including: forming a channel through a substrate; depositing a layer of polycrystalline silicon on sidewalls of the channel; oxidizing uncovered surfaces of the polycrystalline silicon with an oxidation agent, the oxidizing agent causing formation of an oxidized layer, the oxidized layer having a uniform thickness on uncovered surfaces of the polycrystalline silicon; removing the oxidized layer from the channel with a removal agent; and repeating steps of oxidizing uncovered surfaces and removing the oxidized layer until removing a predetermined amount of the layer of polycrystalline silicon.

Example 2. The method of example 1, where oxidizing uncovered surfaces is executed with a solution containing the oxidizing agent.

Example 3. The method of one of examples 1 or 2, where the removal agent includes a solution that includes HF.

Example 4. The method of one of examples 1 to 3, where forming the channel includes forming a channel through a stack of alternating layers of dielectric material as part of a NAND memory fabrication process.

Example 5. The method of one of examples 1 to 4, where the channel has an aspect ratio greater than 50:1.

Example 6. The method of one of examples 1 to 5, where the oxidizing agent includes a solution of hydrogen peroxide in water.

Example 7. A method of processing a substrate, the method including: forming a layer of silicon based material having a first thickness over a semiconductor substrate; growing a layer of oxidized silicon based material on the layer of silicon based material by wetting the layer of silicon based material with an oxidizing solution; etching the layer of oxidized silicon based material by wetting the layer of oxidized silicon based material with a oxide etching solution; and repeating the steps of growing and etching until the layer of silicon based material has a second thickness lower than a predetermined thickness.

Example 8. The method of example 7 where the silicon based material is polysilicon or single crystal silicon.

Example 9. The method of one of examples 7 or 8, further including forming a pattern on the silicon based material prior to growing the layer of oxidized silicon based material on exposed areas of the silicon based material.

Example 10. The method of one of examples 7 to 9, further including rinsing the oxidized silicon based material with a first rinsing solution prior to etching the oxidized silicon based material and rinsing the silicon based material with a second rinsing solution after etching away the oxidized silicon based material.

Example 11. The method of one of examples 7 to 10, where the first rinsing solution and the second rinsing solution are deionized water.

Example 12. The method of one of examples 7 to 11, where the oxidizing solution is hydrogen peroxide in water with a concentration between about 1% and 30% by weight.

Example 13. The method of one of examples 7 to 12, where the oxide etching solution is hydrogen fluoride in water with a concentration between about 0.1% and 10% by weight.

Example 14. The method of one of examples 7 to 13, where the silicon based material is wetted with the oxidizing solution by immersing it in a first bath and the layer of oxidized silicon based material is wetted with the oxide etching solution by immersing it in a second bath.

Example 15. The method of one of examples 7 to 14, where the silicon based material is wetted with the oxidizing solution by immersing it in a bath and the layer of oxidized silicon based material is wetted with the oxide etching solution in a wet spray etching tool.

Example 16. The method of one of examples 7 to 15, where the silicon based material is wetted with the oxidizing solution in a wet spray etching tool and the layer of oxidized silicon based material is wetted with the oxide etching solution in the wet spray etching tool.

Example 17. A method of forming a 3D NAND device, the method including: forming a channel in a 3D NAND dielectric stack; depositing a layer of polysilicon having a first thickness over sidewalls of the channel; performing a cyclic etching process, where each cycle includes forming an oxide layer on the layer of polysilicon by wetting exposed surfaces of the layer of polysilicon with a first solution including an oxidizing agent, and removing the oxidized layer from the layer of polysilicon with a second solution including an oxide etching agent; and, where the cyclic etching process is terminated after the layer of polysilicon has a second thickness over the sidewalls of the channel, the second thickness being lower than the first thickness by a predetermined thickness.

Example 18. The method of example 17, further including rinsing the oxidized silicon based material with deionized water prior to etching the oxidized silicon based material and rinsing the silicon based material with deionized water after etching away the oxidized silicon based material.

Example 19. The method of one of examples 17 or 18, where the first solution is hydrogen peroxide in water with a concentration between about 1% and 30% by weight.

Example 20. The method of one of examples 17 to 19, where the second solution is hydrogen fluoride in water with a concentration between about 0.1% and 10% by weight.

Example 21. A method of processing a substrate, the method including: depositing a layer of silicon based material on a substrate; oxidizing uncovered surfaces of the silicon based material with an oxidation agent, the oxidizing agent causing formation of an oxidized layer, the oxidized layer having a uniform thickness on uncovered surfaces of the silicon based material; removing the oxidized layer from the silicon based material with a removal agent; and repeating steps of oxidizing uncovered surfaces and removing the oxidized layer until removing a predetermined amount of the layer of silicon based material.

Example 22. The method of example 21, where oxidizing uncovered surfaces is executed with a solution containing the oxidizing agent.

Example 23. The method of one of examples 21 or 22, where the oxidizing agent includes a solution of hydrogen peroxide in water.

Example 24. The method of one of examples 21 to 23, where the removal agent includes a solution that includes HF.

Example 25. The method of one of examples 21 to 24, further including forming a transistor where the silicon based material is a channel of the transistor.

Example 26. The method of one of examples 21 to 25, where the transistor is a silicon on insulator transistor (SOI) with a single crystal silicon channel.

Example 27. The method of one of examples 21 to 26, where the SOI transistor is a fully depleted SOI transistor or a partially depleted SOI transistor.

Example 28. The method of one of examples 21 to 27, where the transistor is a polysilicon thin film transistor (TFT).

Example 29. The method of one of examples 21 to 28, where the transistor is a NAND nonvolatile transistor with a polysilicon transistor channel.

Example 30. The method of one of examples 21 to 29, where polysilicon transistor channel is formed on a sidewall of a channel in a 3D NAND memory array.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
    forming a high aspect ratio (HAR) channel through a substrate, the HAR channel having an aspect ratio greater than 50:1;
    depositing a layer of polycrystalline silicon on sidewalls of the HAR channel;
    delivering an oxidizing agent into the HAR channel to oxidize uncovered surfaces of the layer of polycrystalline silicon, the oxidizing agent causing formation of an oxidized layer, the oxidized layer having a uniform thickness on the uncovered surfaces of the layer of polycrystalline silicon;
    delivering a removal agent into the HAR channel to remove the oxidized layer from the HAR channel; and
    repeating steps of oxidizing the uncovered surfaces and removing the oxidized layer until removing a predetermined amount of the layer of polycrystalline silicon.

2. The method of claim 1, wherein oxidizing uncovered surfaces is executed with a solution containing the oxidizing agent.

3. The method of claim 1, wherein the removal agent includes a solution that includes HF.

4. The method of claim 1, wherein forming the HAR channel includes forming a channel through a stack of alternating layers of dielectric material as part of a NAND memory fabrication process.

5. The method of claim 1, wherein the oxidizing agent includes a solution of hydrogen peroxide in water.

6. The method of claim 1, wherein the oxidizing agent includes a solution comprising ozone.

7. The method of claim 1, wherein the polysilicon is dope with phosphorous.

8. The method of claim 1, further comprising rinsing the oxidized layer with deionized water prior to removing the oxidized layer.

9. The method of claim 1, further comprising rinsing the polycrystalline silicon with deionized water after removing the oxidized layer.

10. The method of claim 1, wherein after removing the predetermined amount of the layer of polycrystalline silicon, the layer of polycrystalline silicon on the sidewalls having a final thickness between 5 nm and 50 nm.

11. A method of forming a 3D NAND device, the method comprising:
    forming a high aspect ratio (HAR) channel in a 3D NAND dielectric stack;
    depositing a layer of polysilicon having a first thickness over sidewalls of the HAR channel;
    performing a cyclic etching process, wherein each cycle comprises
        forming an oxide layer on the layer of polysilicon by wetting exposed surfaces of the layer of polysilicon within the HAR channel with a first solution comprising an oxidizing agent, and
        removing the oxidized layer within the HAR channel from the layer of polysilicon with a second solution comprising an oxide etching agent, and wherein the cyclic etching process is terminated after the layer of polysilicon has a second thickness over the sidewalls of the HAR channel, the second thickness being lower than the first thickness by a predetermined thickness.

12. The method of claim 11, further comprising rinsing the oxidized silicon based material with deionized water prior to etching the oxidized silicon based material and rinsing the silicon based material with deionized water after etching away the oxidized silicon based material.

13. The method of claim 11, wherein the first solution is hydrogen peroxide in water with a concentration between about 1% and 30% by weight.

14. The method of claim 11, wherein the second solution is hydrogen fluoride in water with a concentration between about 0.1% and 10% by weight.

15. A method of forming a 3D NAND device, the method comprising:
    forming a high aspect ratio (HAR) channel in a 3D NAND dielectric stack;
    depositing a layer of polysilicon having a first thickness over sidewalls of the HAR channel;
    performing a cyclic etching process, wherein each cycle comprises
        forming an oxide layer on the layer of polysilicon by wetting exposed surfaces of the layer of polysilicon within the HAR channel with a first solution comprising an oxidizing agent,
        rinsing the oxide layer with deionized water;
        removing the oxidized layer within the HAR channel from the layer of polysilicon with a second solution comprising an oxide etching agent; and
        rinsing the polysilicon with deionized water, and
    wherein the cyclic etching process is terminated after the layer of polysilicon has a second thickness over the sidewalls of the HAR channel, the second thickness being lower than the first thickness by a predetermined thickness.

16. The method of claim 15, wherein the first solution is hydrogen peroxide in water with a concentration between about 1% and 30% by weight.

17. The method of claim 15, wherein the second solution is hydrogen fluoride in water with a concentration between about 0.1% and 10% by weight.

18. The method of claim 15, wherein the exposed surfaces of the layer of polysilicon is wetted with the first solution by immersing it in a first bath and the oxide layer is wetted with the second solution by immersing it in a second bath.

19. The method of claim 15, wherein the exposed surfaces of the layer of polysilicon is wetted with the first solution by immersing it in a bath and the oxide layer is wetted with the oxide etching solution in a wet spray etching tool.

20. The method of claim 15, wherein the exposed surfaces of the layer of polysilicon is wetted with the first solution in a wet spray etching tool and the oxide layer is wetted with the second solution in the wet spray etching tool.

* * * * *